United States Patent
Nawata

(10) Patent No.: US 11,714,352 B2
(45) Date of Patent: Aug. 1, 2023

(54) IMPRINTING APPARATUS, IMPRINTING METHOD, METHOD FOR PRODUCING ARTICLE, SUBSTRATE, AND MOLD

(71) Applicant: CANON KABUSHIKI KAISHA, Tokyo (JP)

(72) Inventor: Ryo Nawata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 382 days.

(21) Appl. No.: 17/092,497

(22) Filed: Nov. 9, 2020

(65) Prior Publication Data

US 2021/0157230 A1    May 27, 2021

(30) Foreign Application Priority Data

Nov. 27, 2019  (JP) .................. 2019-214456

(51) Int. Cl.
- *B29C 59/00* (2006.01)
- *G03F 7/00* (2006.01)
- *B29C 59/02* (2006.01)

(52) U.S. Cl.
CPC .......... *G03F 7/0002* (2013.01); *B29C 59/002* (2013.01); *B29C 59/022* (2013.01)

(58) Field of Classification Search
None
See application file for complete search history.

(56) References Cited

U.S. PATENT DOCUMENTS

2014/0367874 A1* 12/2014 Yamamoto ............ G03F 7/0002
264/293

FOREIGN PATENT DOCUMENTS

JP       2007 281 072 A  * 10/2007
JP          2007281072 A     10/2007

* cited by examiner

*Primary Examiner* — Mohammad M Ameen
(74) *Attorney, Agent, or Firm* — Rossi, Kimms & McDowell LLP

(57) ABSTRACT

An imprinting apparatus which is advantageous in improving the overlay accuracy in a shot located on an outer circumference of a substrate is provided. An imprinting apparatus which forms a pattern of an imprint material above a shot region of a substrate by performing alignment between each shot region of the substrate and a mold using a plurality of marks provided in each shot region of the substrate and a plurality of marks on the mold includes: a detection unit configured to detect at least a plurality of marks on the substrate in each shot region; and a control unit configured to use a first mark which is closest to a center of the substrate, a second mark which is arranged in a direction of a first axis along one side of the shot region with respect to the first mark, and a third mark which is arranged in a direction of a second axis perpendicular to the first axis with respect to the first mark for the alignment in each shot region, wherein the control unit uses, as the second mark, a mark which is arranged at a position closet to the center of the substrate in the shot region than that in a case in which the shot region is not located on the outer circumferential portion of the substrate when a shot region which is located on an outer circumferential portion of the substrate and whose center is located within the range of ±45° from the first axis is subjected to the alignment, and the control unit uses, as the third mark, a mark which is arranged at a position closer to the center of the substrate in the shot region than that in a case in which the shot region is not located on the outer circumferential portion of the substrate when a shot region which is located on the outer circumferential portion of the substrate and whose center is located within the range of ±45° from the second axis is subjected to the alignment.

17 Claims, 12 Drawing Sheets

IMPRINTING APPARATUS, IMPRINTING METHOD, METHOD FOR PRODUCING ARTICLE, SUBSTRATE, AND MOLD

BACKGROUND OF THE INVENTION

Field of the Invention

The present invention relates to an imprinting apparatus, an imprinting method, a method for producing an article, a substrate, and a mold.

Description of the Related Art

As methods for producing an article such as a semiconductor device and a MEMS, imprinting methods for molding an imprint material above a substrate using a mold are known. Imprinting methods includes supplying an imprint material above a substrate and bringing the supplied imprint material into contact with a mold (mold pressing). Furthermore, the imprint material is cured while the imprint material is brought into contact with the mold and then the mold is separated (released) from the cured imprint material. Thus, a pattern of the imprint material is formed above the substrate.

In an imprint technique, photo-curing methods exist as one of methods for curing an imprint material. In photo-curing methods, an imprint material supplied to a region above a substrate in which a pattern is formed (a shot region) is cured by irradiating the imprint material with light (hereinafter referred to as "main exposure") while the imprint material is brought into contact with a mold. Furthermore, this is a method for forming a pattern of an imprint material above a substrate by separating a mold from the cured imprint material.

In a process of producing a semiconductor device, a plurality of patterns overlap. Therefore, it is necessary to match a position of a shot region (a pattern) formed on a substrate with a position of a pattern formed on a mold. The accuracy of the alignment between a mold and a substrate is referred to as the "overlay accuracy." In addition, in an imprinting apparatus, a technique for improving the overlay accuracy has been proposed in the related art. As such a technique, in Japanese Patent Laid-Open No. 2007-281072, the overlay accuracy is improved by measuring the deviation between an alignment mark above a substrate and an alignment mark above a mold using an alignment scope and driving a substrate stage so that the deviation is reduced.

An imprinting process includes a process of irradiating an imprint material with light to cure the imprint material (a main exposure). Furthermore, in order to improve the overlay accuracy, there is a process of applying heat to a substrate by irradiating the substrate, in which the substrate is irradiated with light to heat the substrate so that the substrate is thermally deformed (heating and exposing) such that a shape of the substrate is made to match a shape of a mold up to higher-order shape components. When heat is applied to a substrate through such a process, in a shot region in which an outer circumferential region (an edge region) of a substrate is not included, the restraint conditions of the substrate chuck are substantially uniform. Thus, the entire shot region of the substrate extends substantially evenly toward outside of the shot. However, in a shot region in which the outer circumferential region of the substrate is included, the restraint conditions of the substrate significantly differ with the outer circumferential region of the substrate as a boundary. Thus, amounts of elongation of the substrate differ between the central part of the shot substrate and the outer circumferential part of the substrate. The imprinting apparatus in Japanese Patent Laid-Open No. 2007-281072 does not mention the arrangement of alignment marks and a method for selecting an alignment mark in a shot in which an outer circumferential region of a substrate is included.

SUMMARY OF THE INVENTION

The present invention provides, for example, an imprinting apparatus which is advantageous in terms of improving the overlay accuracy in a shot located on an outer circumference of a substrate.

In order to achieve the above-described object, the present invention includes an imprinting apparatus which forms a pattern of an imprint material on a shot region of a substrate by performing alignment between each shot region of the substrate and a mold using a plurality of marks provided in each shot region of the substrate and a plurality of marks on the mold, including, a detection unit configured to detect at least a plurality of marks on the substrate in each shot region, and a control unit configured to use a first mark which is closest to a center of the substrate, a second mark which is arranged in a direction of a first axis along one side of the shot region with respect to the first mark, and a third mark which is arranged in a direction of a second axis perpendicular to the first axis with respect to the first mark for the alignment in each shot region, wherein the control unit uses, as the second mark, a mark which is arranged at a position closet to the center of the substrate in the shot region than that in a case in which the shot region is not located on the outer circumferential portion of the substrate when a shot region which is located on an outer circumferential portion of the substrate and whose center is located within the range of ±45° from the first axis is subjected to alignment, and the control unit uses, as the third mark, a mark which is arranged at a position closer to the center of the substrate in the shot region than that in a case in which the shot region is not located on the outer circumferential portion of the substrate when a shot region which is located on the outer circumferential portion of the substrate and whose center is located within the range of ±45° from the second axis is subjected to the alignment.

Further features of the present invention will become apparent from the following description of exemplary embodiments with reference to the attached drawings.

DESCRIPTION OF THE EMBODIMENTS

Figure 1A:
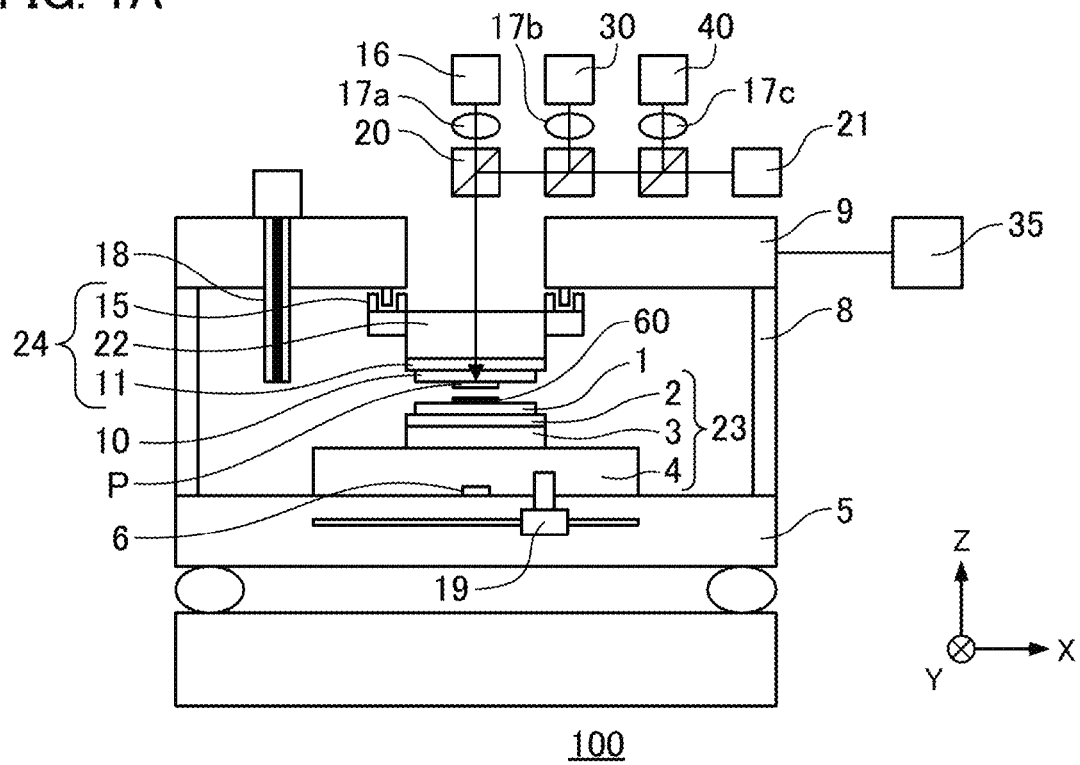
FIGS. 1A and 1B are schematic diagrams illustrating a configuration of an imprinting apparatus in a first embodiment.

Preferred embodiments of the present invention will be described in detail below with reference to the accompanying drawings. In each drawing, constituent elements which are the same are denoted by the same reference numerals and duplicated description thereof will be omitted.

First Embodiment

Figure 1B:
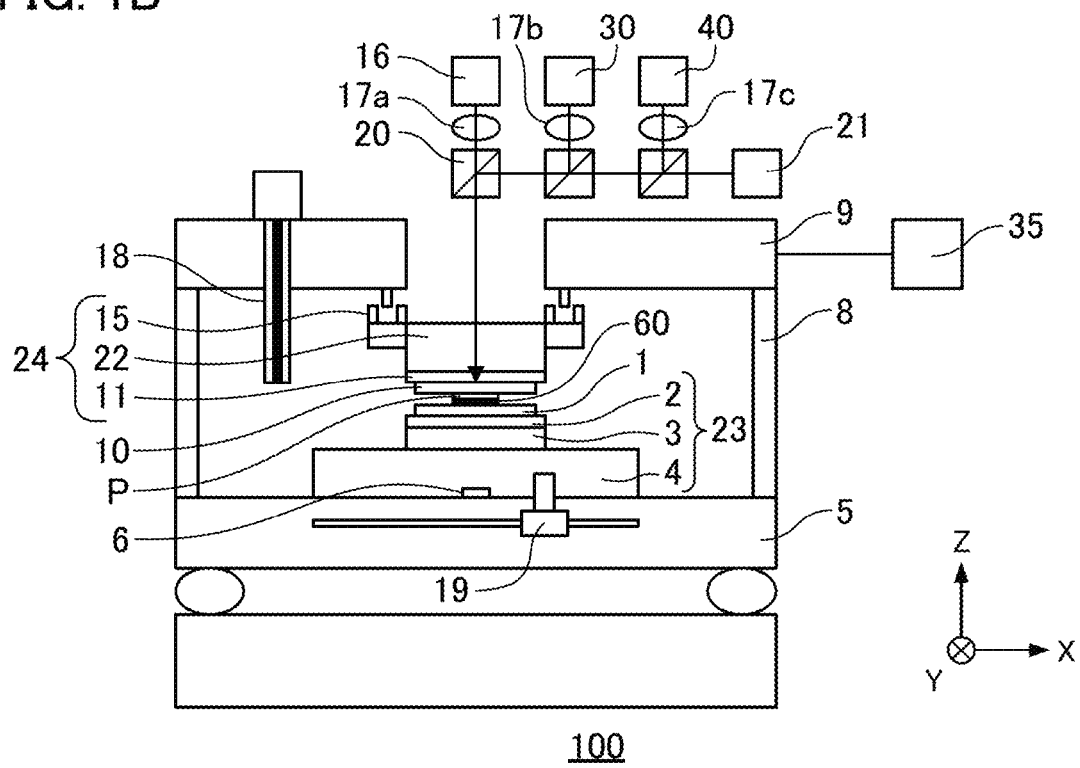

FIGS. 1A and 1B are schematic diagrams illustrating a configuration of an imprinting apparatus 100 in a first embodiment. The configuration of the imprinting apparatus 100 will be described with reference to FIGS. 1A and 1B. FIG. 1A illustrates a state in which a mold 10 is not in contact with an imprint material 60 above a substrate 1. FIG. 1B illustrates a state in which the mold 10 is in contact with the imprint material 60 above the substrate 1. In the following drawings, a description will be provided assuming that an X axis and a Y axis which are orthogonal to each other are set in a surface parallel to a surface of a substrate and a direction perpendicular to the X axis and the Y axis is set as a Z axis.

The imprinting apparatus 100 includes a substrate holding unit 23 configured to hold the substrate 1, a supply unit 18 configured to supply the imprint material 60, a mold holding unit 24 configured to hold the mold 10, a first light source 16, a second light source 30, a third light source 40, an alignment scope 21, and a control unit 35. The imprinting apparatus 100 is an apparatus configured to form a pattern of a cured product having a concave and convex pattern of the mold 10 transferred thereto by bringing the imprint material 60 supplied above the substrate 1 into contact with the mold 10 and applying curing energy to the imprint material 60. The imprinting apparatus 100 of FIGS. 1A and 1B are used for producing a device such as a semiconductor device as an article. Here, the imprinting apparatus 100 in which a photo-curing method is adopted will be described.

The substrate holding unit 23 includes a substrate chuck 2, a θ stage 3 (a rotational drive mechanism), and an XY stage 4 (an XY drive mechanism). The substrate chuck 2 holds the substrate 1 using, for example, a vacuum suction force or an electrostatic suction force. In FIGS. 1A and 1B, the substrate 1 is held by the substrate chuck 2. The θ stage 3 is arranged above the XY stage 4 configured to correct a position of the substrate 1 in a θ direction fa rotation direction around the Z axis) and position the substrate 1 in an X direction aid a Y direction. The XY stage 4 is driven through the linear motor 19 in the X direction and the Y direction. The θ stage 3 and the XY stage 4 hold the substrate chuck 2 and move the substrate 1 held by the substrate chuck 2. The XY stage 4 is placed above a base 5. Furthermore, the substrate holding unit 23 may have a drive system configured to ad just a position of the substrate 1 in the Z axis direction, a tilt function of correcting the inclination of the substrate 1, and the like. A linear encoder 6 is attached above the base 5 in the X direction and the Y direction and measures a position of the XY stage 4. A support column 8 stands upright above the base 5 and supports a top plate 9.

For example, a single crystal silicon substrate, a silicon on insulator (SOI) substrate, or the like may be used as the substrate 1. Furthermore, glass, ceramics, metals, semiconductors, resins, and the like may be used for the substrate 1 and a member made of a material different from that of the substrate may be formed on a surface of the substrate if necessary. To be specific, the substrate 1 includes a silicon wafer, a compound semiconductors wafer, quartz glass, and the like. A plurality of shot regions are formed on the substrate 1 and the supply unit 18 supplies (applies) the imprint material 60 above the shot regions. Each of the shot regions is a region in which a pattern of an imprint material is formed. The imprinting apparatus 100 can form a pattern on the entire surface of the substrate 1 by repeatedly performing the imprinting processing of forming a pattern of an imprint material for each shot region. Furthermore, a plurality of alignment marks used for alignment with the mold 10 are provided in each shot region of the substrate 1.

As the imprint material 60, curable compositions (referred to as "uncured resins" in some cases) which are cured when curing energy is applied to the curable compositions are used. Electromagnetic waves or the like may be used as the curing energy. The electromagnetic waves may be, for example, light whose wavelength is selected from the range of larger than or equal to 10 nm and less than or equal to 1 mm, for example, ultraviolet rays or the like. The curable compositions may be compositions which are cured through irradiation of light. Of these, photocurable compositions which are cured through irradiation of light may contain at least polymerizable compounds and photopolymerization initiators and may further contain non-polymerizable compounds or solvents if necessary. Each of the non-polymerizable compounds is at least one selected from the group of sensitizers, hydrogen donors, internal release mold release agents, surfactants, antioxidants, polymer components, and the like. In this embodiment, as an example, a photocurable composition having a property of being cured using ultraviolet rays is used as the imprint material 60. The imprint material 60 may be arranged above the substrate 1 in the form of liquid droplets or in the form of islands or films formed by connecting a plurality of droplets using the supply unit 18. The viscosity of an imprint material (the viscosity at 25° C.) may be, for example, larger than or equal to 1 mPa·s and less than or equal to 100 mPa·s. Furthermore, the imprint material 60 may be applied in a film form above a substrate using a spin coater or a slit coater.

The supply unit 18 (a dispenser) supplies the imprint material 60 onto the substrate 1. The supply unit 18 has, for example, a discharge nozzle (not shown) and supplies the imprint material 60 onto the substrate 1 through a discharge nozzle. In this embodiment, the supply unit 18 supplies an imprint material onto the substrate 1, as an example, by dropping the liquid imprint material 60 on a surface of the substrate 1. An amount of imprint material supplied by the supply unit 18 may be determined using a required thickness of imprint material, a pattern density to be formed, and the like. Furthermore, the supply unit 18 may not necessarily be provided in the imprinting apparatus 100 or an imprint material may be supplied above the substrate 1 by a supply unit provided outside of the imprinting apparatus 100.

The mold 10 is a mold configured to mold an imprint material above a substrate. The mold may also be referred to as a "template or an original plate." The mold 10 has, for example, a pattern region P which has a rectangular outer circumferential portion and in which a concave and convex pattern transferred to the imprint material 60 supplied above the substrate 1 is formed on a surface thereof facing the substrate 1 in a three-dimensional shape. The pattern region P is also referred to as a "mesa section." The pattern region P is formed in a convex portion of several tens of gin to several hundreds of μm so that a region other than the pattern region P of the mold 10 (a region surrounding the pattern region P) does not come into contact with the substrate 1. The mold 10 is made of a material through which light (ultraviolet rays) used for curing an imprint material above a substrate is transmitted, for example, quartz or the like. Furthermore, the mold 10 has a plurality of alignment marks which are used for alignment with the substrate 1 and correspond to the alignment marks included in the substrate 1.

The mold holding unit 24 includes a mold chuck 11, a mold stage 22, and a linear actuator 15 (a mold drive mechanism). The mold chuck 11 holds the mold 10 using a vacuum suction force, an electrostatic suction force, and the like. The mold chuck 11 is held using the mold stage 22. The mold stage 22 has a function of adjusting a Z position of the mold 10 and a tilt function for correcting the inclination of the mold 10. The linear actuator 15 drives the mold 10 held by the mold chuck 11 in the Z axis direction to bring the mold 10 into contact with the imprint material 60 above the substrate 1 and separate the mold 10. The linear actuator 15 is, for example, an air cylinder or a linear motor. The mold stage 22 may have a position adjustment function in the X axis direction, the Y axis direction or the θ direction of each axis. The mold chuck 11 and the mold stage 22 each have an opening (not shown) through which light radiated from the first light source 16 passes to the mold 10.

In the processing of curing the imprint material 60 above the substrate 1, the first light source 16 irradiates the substrate 1 with light (ultraviolet rays) used for curing the imprint material 60 via a collimator lens 17a. Here, an i-line (365 nm) is used as the first light source 16. A beam splitter 20 is in an optical path of the first light source 16 and separates light used for observing a contact state of the mold 10 and light used for curing the imprint material 60 using the alignment scope 21. The alignment scope 21 captures the pattern region P of the mole 10 via the beam splitter 20. Furthermore, the alignment scope 21 also functions as a detection unit configured to detect the mold 10 and an alignment mark AM formed on the substrate 1.

In the processing of curing the imprint material 60 above the substrate 1, the second light source 30 irradiates the substrate 1 with light (ultraviolet rays) used to enhance the viscoelasticity of the imprint material 60 via the collimator lens 17b. The second light source 30 can change the illuminance, irradiation region, and irradiation time of light (ultraviolet rays) used for curing the imprint material 60. Here, a light source having a wavelength of 405 nm is used as the second light source 30.

In the alignment processing between the mold 10 and the substrate 1, the third light source 40 irradiates the substrate 1 with light used for thermally deforming the substrate 1 via the collimator lens 17c. Since the third light source 40 is intended to thermally deform the substrate 1, a wavelength band of the second light source 30 intended to enhance the viscoelasticity of the imprint material 60 is different from that of the third light source 40. Here, a light source having a wavelength of 465 nm is used as the third light source 40.

The control unit 35 controls an operation, adjustment, and the like of each unit constituting the imprinting apparatus 100. The control unit 35 may be constituted of, for example, a computer or the like, be connected to each unit constituting the imprinting apparatus 100 via a circuit, and perform control of each unit in accordance with a program or the like. The control unit 35 may be provided in the imprinting apparatus 100 or may be installed at a location different from the imprinting apparatus 100 and perform control remotely.

Figure 2:
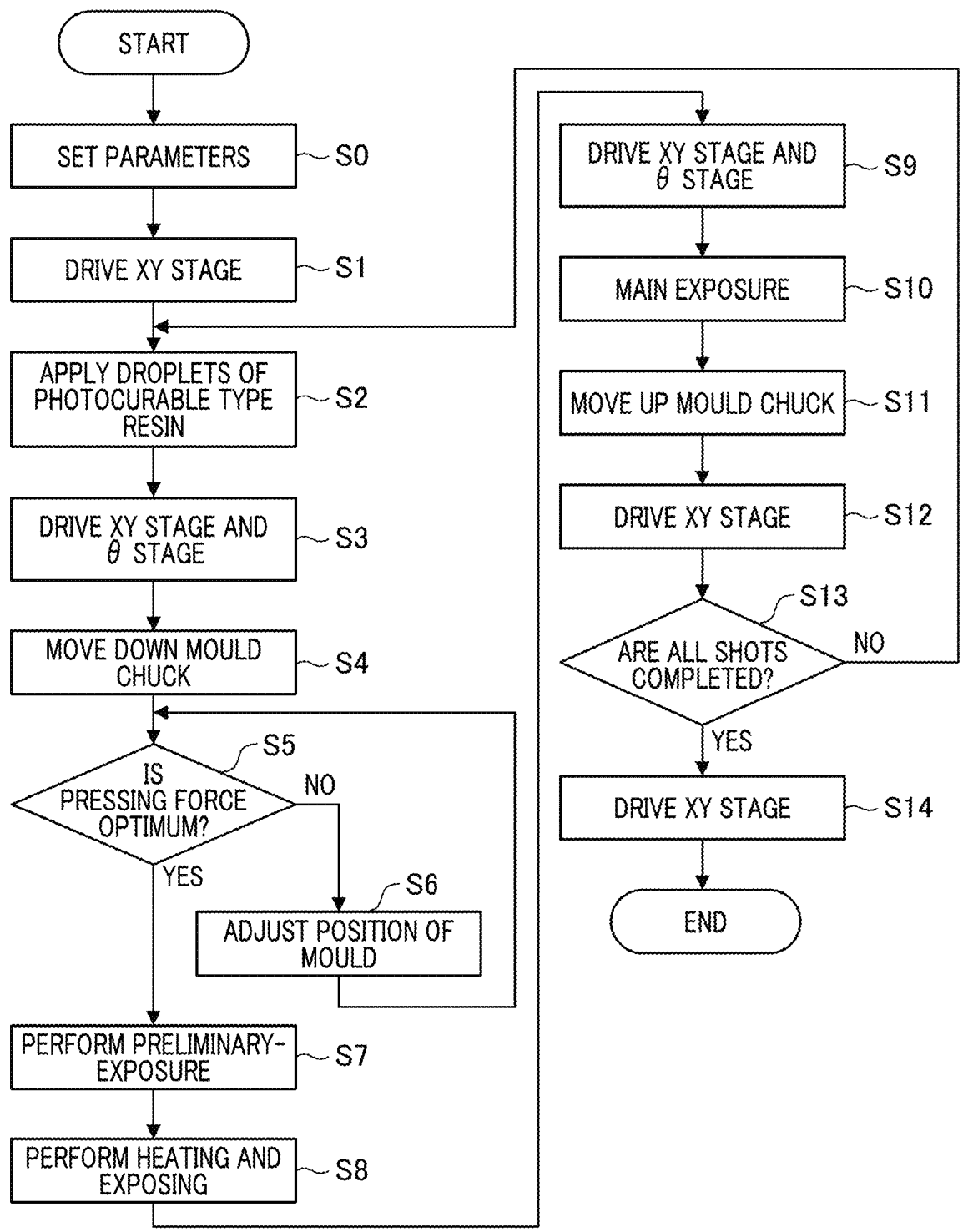
FIG. 2 is a flowchart for describing imprinting processing according to the first embodiment.

The imprinting processing using the imprinting apparatus 100 constituted as described above will be described below. FIG. 2 is a flowchart for describing the imprinting processing according to the first embodiment. Each step may be performed through the control of each unit of the imprinting apparatus 100 by the control unit 35. First, various parameters required for imprinting are set (Step S0). Subsequently, the XY stage 4 of the imprinting apparatus 100 is driven, the substrate chuck 2 on which the substrate 1 is placed is moved in the X direction and the Y direction, and a shot region which is a target of the imprinting processing (hereinafter referred to as a "target shot region") is arranged below the supply unit 18 (Step S1). Furthermore, a predetermined amount of uncured imprint material 60 is supplied above the substrate 1 (Step S2).

The XY stage 4 is driven again to move the substrate chuck 2 so that a target shot region is arranged at a position facing the pattern region P of the mold 10 and the θ stage 3 is driven to correct a position of the substrate 1 in the θ direction (Step S3). Subsequently, the mold stage 22 is moved in a −Z direction by driving the linear actuator 15 and the mold 10 is brought into contact with the uncured imprint material 60 above the substrate 1 (a contact step; Step S4). In Step S4, instead of moving the mold stage 22, the substrate holding unit 23 may be moved in the Z direction or each of the mold stage 22 and the substrate holding unit 23 may be moved. A plurality of load cells (not shown) may be provided in the mold chuck 11 or the mold stage 22. From outputs of the plurality of load cells, the control unit 35 performs a determination concerning whether a contact force generated when the mold 10 is brought into contact with the uncured imprint material 60 above the substrate 1 is optimum (Step S5).

When it is determined that the contact force is not optimum (Step S5; NO), the mold stage 22 changes the inclination of the mold chuck 11 in accordance with the output of the plurality of load cells so that the contact force between the mold 10 and the imprint material 60 reaches a predetermined value. Furthermore, by changing an amount of pressing using the linear actuator 15, a force of pressing the mold 10 against an imprint material is adjusted (Step S6).

Figure 3:
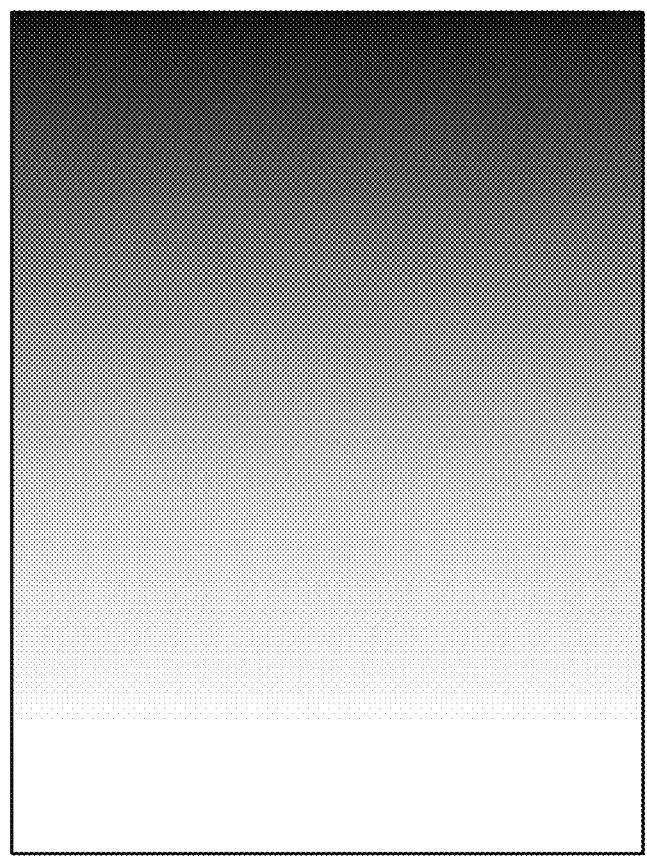
FIG. 3 is a diagram illustrating an example of a case in which the entire surface of a shot region is subjected to heating and exposing.

When it is determined that the contact force is optimum (Step S5; YES), the imprint material 60 above the substrate 1 is irradiated (subjected to preliminary-exposure) with light (ultraviolet rays) from the second light source 30 and the viscoelasticity of the imprint material 60 is increased (Step S7). After that, in order to thermally deform the substrate 1, the substrate 1 is irradiated with light from the third light source 40 (hereinafter referred to as "heating and exposing") (Step S8). In the heating and exposing, a part of a shot region may be irradiated with light or the entire surface may be irradiated. FIG. 3 is a diagram illustrating an example in a case in which the entire surface of a shot region is subjected to heating and exposing. When the entire surface of the shot region is irradiated with light, as described in FIG. 3, the illuminance may have a distribution. Thus, it is possible to thermally deform the substrate 1 to have a predetermined shape and it is possible to perform the alignment between the pattern region P of the mold 10 and the shot region of the substrate 1 up to a higher-order shape. Here, since the heat applied in the heating and exposing (Step S8) is conducted through the substrate 1 and diffuses, it is desirable that the heating and exposing (Step S8) be performed immediately before the main exposure (Step S10).

After that, the alignment marks AM formed on the mold 10 and the substrate 1 are detected by the alignment scope 21 and alignment is performed on the basis of the detected measurement results. A relative deviation between the mold 10 and the substrate 1 is obtained from the measurement results, the XY stage 4 and the θ stage 3 are driven, and the alignment between the mold 10 and the substrate 1 is performed (Step S9). Here, although the preliminary-exposure (Step S7), the heating and exposing (Step S8), and the driving of the XY stage 4 and the θ stage 3 (Step S9) are sequentially performed, the steps may be performed at the same time.

After aligning the mold 10 with the substrate 1, the first light source 16 irradiates (performs the main exposure on) the imprint material 60 above the substrate 1 with light (ultraviolet rays) to cure the imprint material 60 (Step S10). The irradiation region of the main exposure is the entire surface of the shot region. If the irradiation of light (ultraviolet rays) for a predetermined is completed, a mold release step in which the mold stage 22 is moved up in a Z direction by driving the linear actuator 15 and the mold 10 is separated from the cured imprint material 60 above the substrate 1 is performed (Step S11). In Step S11, instead of moving the mold stage 22, the substrate holding unit 23 may be moved in the Z direction or each of the mold stage 22 and the substrate holding unit 23 may be moved.

After that, a determination concerning whether a pattern formation on all shot regions above the substrate 1 is completed is performed (Step S12). When there is the remaining shot region in which the pattern of the imprint material is formed, the substrate 1 is moved by driving the XY stage 4 to supply the imprint material 60 to the next target shot region (Step S1). These series of processes are repeatedly performed until the patient formation on all of the shot regions above the substrate 1 is completed. If the pattern formation performed on all of the shot regions is completed, the substrate 1 is moved to a predetermined position by driving the XY stage 4 (Step S13) and the imprinting processing performed on one substrate 1 is completed.

Figure 4:
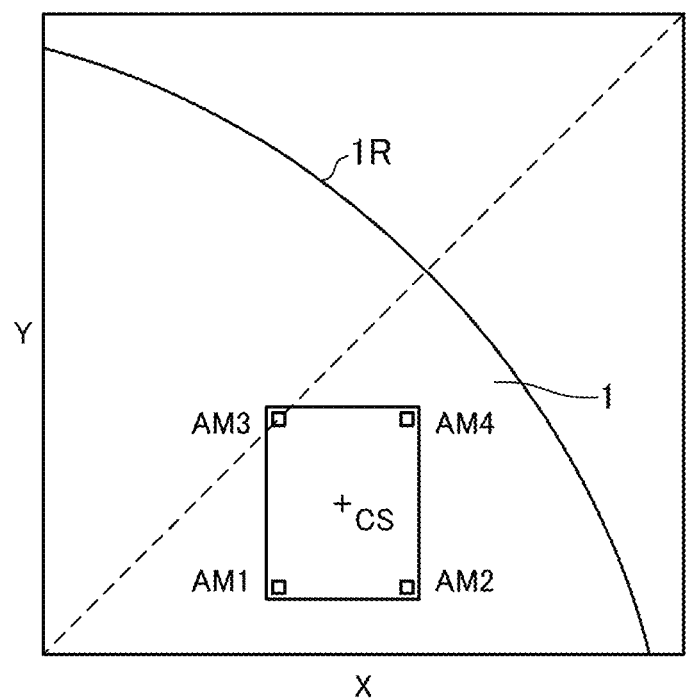
FIG. 4 is a diagram illustrating an example of an alignment mark of a shot which is not located on an outer circumferential portion of a substrate.

Alignment marks AM used for the alignment between the mold 10 and the substrate 1 (Step S9) will be described below. FIG. 4 is a diagram illustrating an example of alignment marks AM of a shot which is not located on the outer circumferential portion of the substrate 1. Here, in an alignment mark which has the shortest distance from a center of the substrate 1, in other words, a shot region, an alignment mark which is closest to the center of the substrate 1 is referred to as a "first alignment mark AM1." An alignment nark located on the X axis of the first alignment mark AM1 is referred to as a "second alignment mark AM2" and an alignment mark located on the Y axis of the first alignment mark AM1 is referred to as a "third alignment mark AM3." Here, the arrangement above the X axis of the first alignment mark AM1" includes a case in which a part of the second alignment mark AM2 is arranged on the X axis passing through a part of the first alignment mark AM1. That is to say, it can be also said that the second alignment mark AM2 is arranged in a direction of the X axis with respect to the first alignment mark AM1. Furthermore, the expression "positioned on the Y axis of the first alignment mark AM1" includes a case in which a part of the third alignment mark AM3 is arranged on the Y axis passing through a part of the first alignment mark AM1. That is to say, it can be said that the third alignment mark AM3 is arranged in a direction of the Y axis with respect to the first alignment mark AM1. In addition, art alignment mark located on a Y axis of a second alignment mark and on an X axis of a third alignment mark is referred to as a "fourth alignment mark AM4." In the present specification, the X axis is an axis along one side of the shot and the Y axis is an axis perpendicular to the X axis.

The alignment scope 21 measures an amount of deviation between each of the alignment marks AM in the shot region above the substrate 1 and the alignment mark (not shown) above the mold 10 corresponding thereto in the X axis direction and the Y axis direction Amounts of deviation of alignment marks in the X axis direction and the Y axis direction are set to (dX1, dY1), (dX2, dY2), (dX3, dY3), and (dX4, dY4). An amount of deviation (ShX4) of the mold 10 in the X axis direction with respect to the shot region above the substrate 1 is approximately expressed by Expression 1 and an amount of deviation (ShY4) in the Y axis direction is approximately expressed by Expression 2.

$$ShX4=(dX1+dX2+dX3-dX4)/4 \quad \text{(Expression 1)}$$

$$ShY4=(dY1+dY2+dY3+dY4)/4 \quad \text{(Expression 2)}$$

Figure 5:
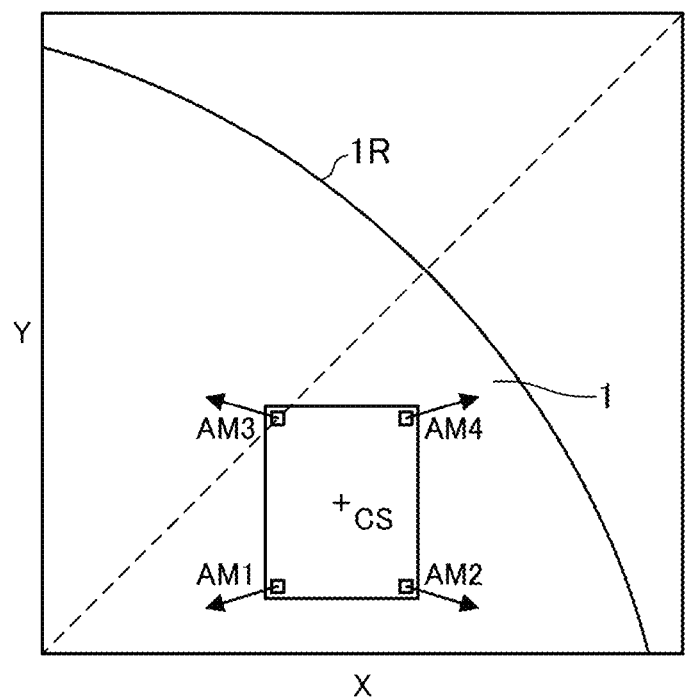
FIG. 5 is a diagram for explaining expansion due to exposure heat of a shot which is not located on an outer circumferential portion.

The imprinting process includes heating and exposing, preliminary-exposure, main exposure, and the like and this exposure heat causes the substrate 1 to thermally expand. FIG. 5 is a diagram for explaining expansion of a shot which is not located on an outer circumferential portion due to exposure heat. In a shot in which an outer circumferential region of the substrate 1 is not included, in other words, a shot which is not located on the outer circumferential portion, the substrate 1 is continuous in all directions outside of the shot region and a restricting force of the substrate chuck 2 is also continuous in all directions outside of the shot region. For this reason, expansion of the shot region due to exposure heat is substantially radial from a center of shot (CS) as illustrated in FIG. 5. Thus, even if a substrate thermally expands due to exposure heat, there is a small influence on the measurement accuracy of the amounts of deviation (ShX4 and ShY4) of the mold 10 in the X axis direction and the Y axis direction with respect to the shot region above the substrate 1.

Figure 6A:
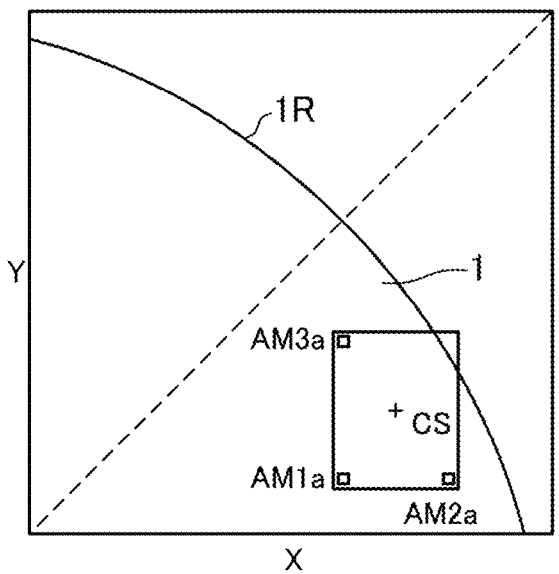
FIGS. 6A and 6B are diagrams illustrating an example of alignment marks of a shot located on an outer circumferential portion of a substrate.
Figure 6B:
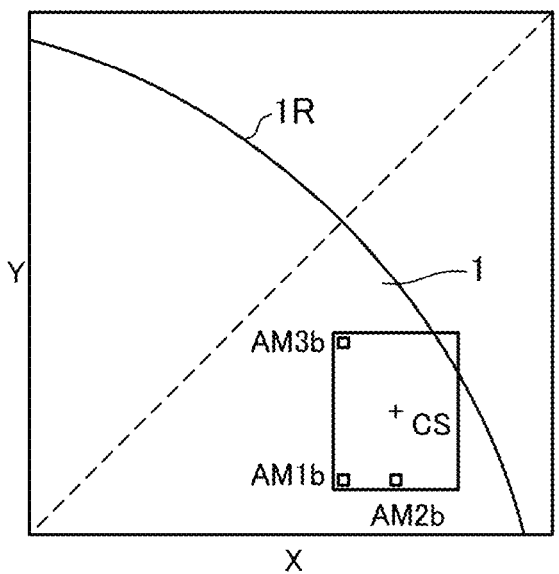

FIGS. 6A and 6B are diagrams illustrating an example of alignment marks AM of a shot located on the outer circumferential portion of the substrate 1. FIGS. 6A and 6B illustrate an example of alignment marks AM of a shot which is arranged on the outer circumferential portion of the substrate 1 and whose center of shot (CS) is within the range of ±45° from the X axis of the substrate 1. Here, the shot located on the outer circumferential portion includes a shot region which is located in the vicinity of an outer circumference 1R of the substrate 1 and includes the outer circumference 1R of the substrate 1 and a shot region which is in contact with the outer circumference 1R. The shot located on the outer circumferential portion can also be referred to as a shot including an outer circumferential region. As a first alignment mark AM1$a$, a second alignment mark AM2$a$, and a third alignment mark AM3*a* in FIG. 6A, the alignment mark of the shot which is not located or the outer circumferential portion of the substrate illustrated in FIG. 4 and alignment marks at the same position in the shot region are used. As illustrated in FIG. 6, when three alignment marks are present, an amount of deviation (ShX3) of the mold 10 in the X axis direction with respect to the shot region above the substrate 1 is approximately expressed by Expression 3 and an amount of deviation (ShY3) in the Y axis direction is approximately expressed by Expression 4.

$$ShX3=(dX1+dX2\times2+dX3)/4 \quad \text{(Expression 3)}$$

$$ShY3=(dY1+dY2+dY3\times2)/4 \quad \text{(Expression 4)}$$

Figure 7A:
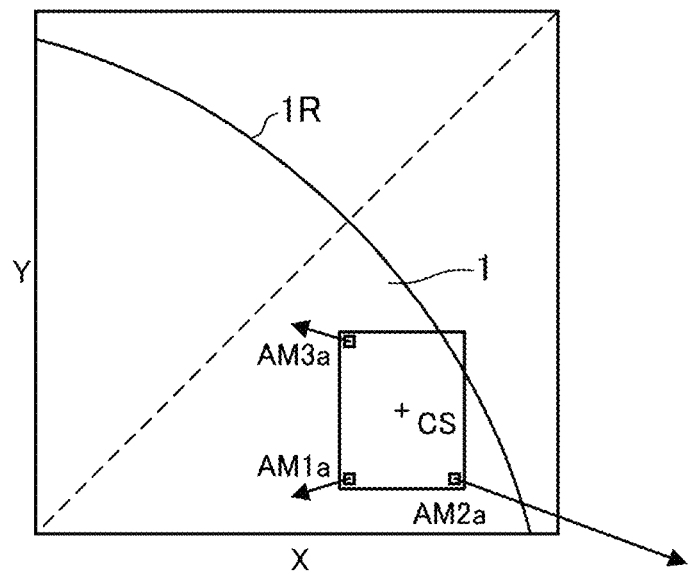
FIGS. 7A and 7B are diagrams for explaining expansion due to exposure heat of a shot located on an outer circumferential portion.
Figure 7B:
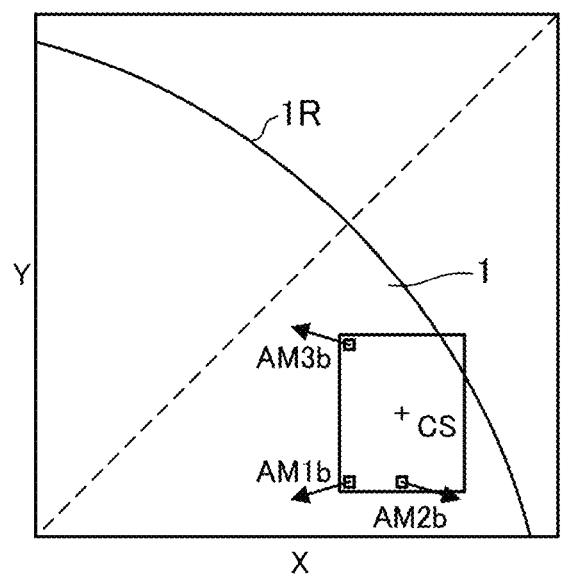

The imprinting process includes heating and exposing, preliminary-exposure, main exposure, and the like and this exposure heat causes the substrate 1 to thermally expand. FIGS. 7A and 7B are diagrams for explaining expansion of a shot located on an outer circumferential portion due to exposure heat. A shot which is located on the outer circumferential portion of the substrate 1 and whose center of shot (CS) is within the range of ±45° from the X axis of the substrate 1 easily extends in the X axis direction due to a geometrical relationship. Furthermore, the substrate 1 is discontinuous in the X axis direction outside of the shot region and a restricting force of the substrate chuck 2 is also discontinuous in the X axis direction. For this reason, an amount of movement of the second alignment mark AM2*a* on the outer circumferential region side of the substrate 1 due to the exposure heal in the X axis direction is larger than an amount of movement of the first alignment mark AM1*a* on a central region side of the substrate 1 as illustrated in FIG. 7A. Moreover, since the amount of movement of the second alignment mark AM2*a* in the X axis direction is affected by the friction between the substrate 1 and the substrate chuck 2, a poor reproducibility is provided. For this reason, if the substrate 1 thermally expands due to exposure heat, the measurement accuracy of the amount of deviation (ShX3) of the mold 10 in the X axis direction with respect to the shot region above the substrate 1 deteriorates.

Thus, in this embodiment, the control unit 35 uses the second alignment mark AM2*b* illustrated in FIG. 6B for alignment. The second alignment mark AM2*b* illustrated in FIG. 6B is arranged at a position closer to a center of the substrate 1 than in the second alignment mark AM2*a* illustrated in FIG. 6A. Thus, as illustrated in FIG. 7B, the second alignment mark AM2*b* is not easily influenced by the outer circumferential portion of the substrate 1 and it is possible to improve the measurement accuracy of the amount of deviation (SbX3) of the mold 10 in the X axis direction with respect to the shot region above the substrate 1. As illustrated in FIG. 6B, the second alignment mark AM2*b* may be arranged so that a distance between the first alignment mark AM1*b* and the second alignment mark AM2*b* is shorter than a distance between the first alignment mark AM1*b* and the third alignment mark AM3*b*. Furthermore, the second alignment mark AM2*b* may be arranged above a midline of the X axis of the shot. Thus, since the second alignment mark AM2*b* is a central portion of the thermal expansion of the substrate 1 due to the exposure heat with respect to the X axis, the second alignment mark AM2*b* does not easily receive the influence of thermal expansion.

Figure 8A:
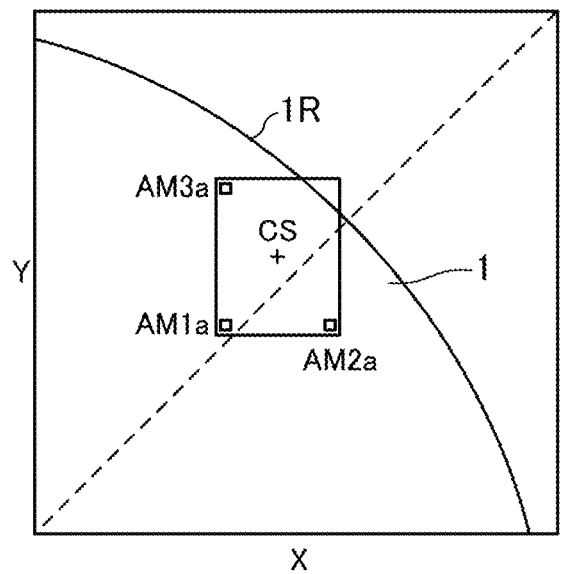
FIGS. 8A and 8B are diagrams illustrating an example of an alignment mark of a shot located on an outer circumferential portion of a substrate.
Figure 8B:
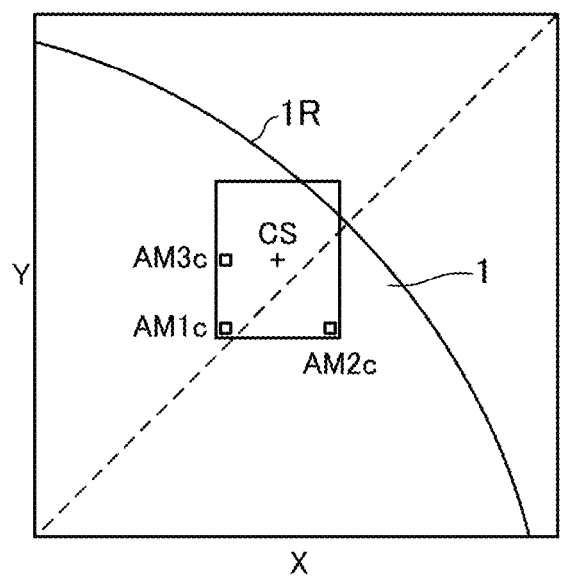

FIGS. 8A and 8B are diagrams illustrating an example of alignment marks of a shot located on an outer circumferential portion of a substrate. FIGS. 8A and 8B illustrate alignment marks AM of a shot which is located on the outer circumferential portion of the substrate 1 and whose center of shot (CS) is within the range of ±45° from the Y axis of the substrate 1. In FIG. 8A, as a first alignment mark AM1*a*, a second alignment mark AM2*a*, and a third alignment mark AM3*a*, alignment marks that have the same positional relationship in the shot region as in the shot which is not located on the outer circumferential portion of the substrate illustrated in FIG. 4 are used.

Figure 9A:
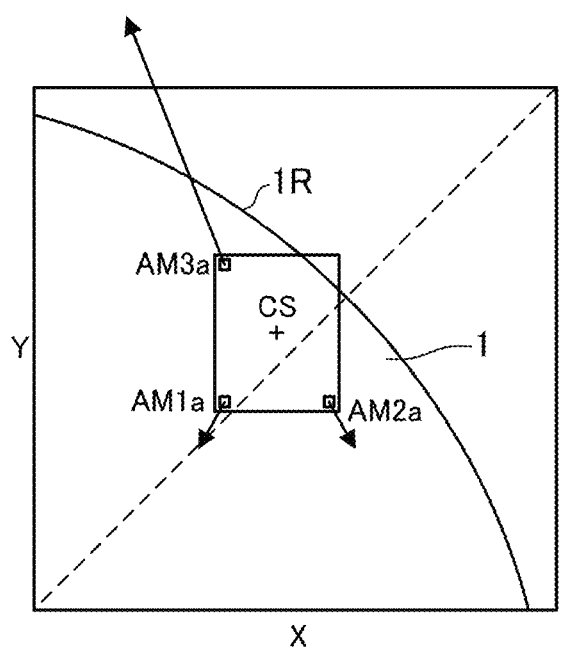
FIGS. 9A and 9B are diagrams for explaining expansion due to exposure heat of a shot located on an outer circumferential portion.
Figure 9B:
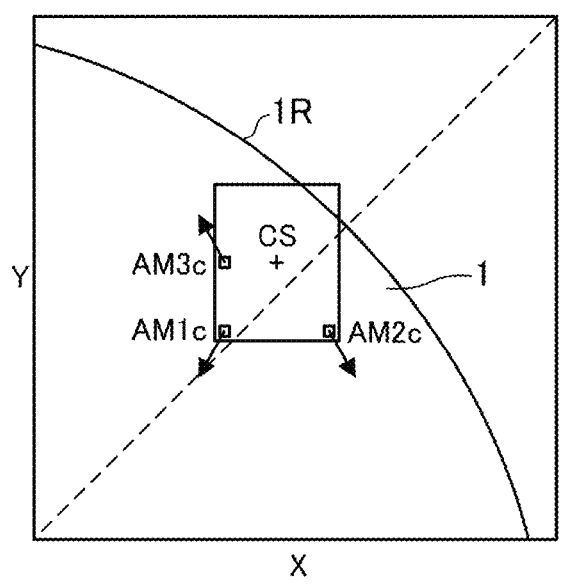

The imprinting process includes heating and exposing, preliminary-exposure, main exposure, and the like and this exposure heat causes the substrate 1 to thermally expand. FIGS. 9A and 9B are diagrams for explaining expansion of a shot located on an outer circumferential portion due to exposure heat. A shot which is located on the outer circumferential portion of the substrate 1 and whose center of shot (CS) is within the range of ±45° from the Y axis of the substrate 1 easily extends in the Y axis direction due to a geometrical relationship. Furthermore, the substrate 1 is discontinuous in the Y axis direction outside of the shot region and a restricting force of the substrate chuck 2 is also discontinuous in the Y axis direction. For this reason, an amount of movement of the third alignment mark AM3*a* on the outer circumferential region side of the substrate 1 due to the exposure heat in the Y axis direction is larger than an amount of movement of the first alignment mark AM1*a* on the central region side of the substrate 1 as illustrated in FIG. 9A. In addition, since the amount of movement of the third alignment mark AM3*a* in the Y axis direction is affected by the friction between the substrate 1 and the substrate chuck 2, a poor reproducibility is provided. For this reason, if the exposure heat causes the substrate 1 to thermally expand, the measurement accuracy of the amount of deviation (ShY3) of the mold 10 in the Y axis direction with respect to the shot region above the substrate 1 deteriorates.

Thus, in this embodiment, the third alignment mark AM3*c* illustrated in FIG. 8B is used for alignment. The third alignment mark AM3*c* illustrated in FIG. 8B is arranged at a position closer to the center of the substrate 1 than in the third alignment mark AM3*a* illustrated in FIG. 8A. Thus, as illustrated in FIG. 9B, the third alignment mark AM3*c* does not easily receive the influence of the outer circumferential portion of the substrate 1 and it is possible to improve the measurement accuracy of the amount of deviation (ShY3) of the mold 10 in the Y axis direction with respect to the shot region above the substrate 1. As illustrated in FIG. 9B, the third alignment mark AM3*c* may be arranged so that a distance between the first alignment mark AM1*c* and the third alignment mark AM3*c* is shorter than a distance between the first alignment mark AM1*c* and the second alignment mark AM2*c*. In addition, the third alignment mark AM3*c* may be arranged above a midline of the Y axis of the shot. Thus, since the third alignment mark AM3*c* is a central portion of the thermal expansion of the substrate 1 due to the exposure heat with respect to the Y axis, the third alignment mark AM3*c* does not easily receive the influence of thermal expansion.

Here, an alignment mark AM of a shot whose center of shot (CS) is located at 45° from the X axis of the substrate 1, in other words, 45° from the Y axis will be described. When a length of one side along the X axis of the shot is shorter than a length of one side along the Y axis of the shot, the processing is performed in the same manner as for shots located on the outer circumferential portion of the substrate 1 and whose center of shot (CS) is within the range of ±45° from the Y axis of the substrate 1. On the other hand, when a length of one side along the X axis of the shot is longer than a length of one side along the Y axis of the shot, the processing is performed in the same manner as for shots located on the outer circumferential portion of the substrate 1 and whose center of shot (CS) is within the rang; of ±45° from the X axis of the substrate 1.

According to this embodiment, it is possible to improve the overlay accuracy in a shot located on an outer circumferential portion of a substrate.

Although only the first to third alignment marks of the alignment marks included in the shot located on the outer circumferential portion have been illustrated for simply performing a description in the drawings of this embodiment, the present invention is not limited thereto. When four or more alignment marks are arranged on the shot located on the outer circumferential portion, the control unit 35 can also select a mark used for alignment from a plurality of alignment marks.

Also, in a case in which a mark used for alignment is selected from the plurality of alignment marks, when the alignment is performed, a weight of an unselected alignment mark may be lower than a weight of a selected alignment mark. In addition, the weight of an unselected alignment mark may be set to zero. That is to say, an unselected alignment mark may not be used for alignment. In this case, in each shot region, a first alignment mark closest to the center of the substrate 1 and at least one of a plurality of second alignment marks arranged in the direction of the X axis with respect to the first alignment mark are used for alignment. Furthermore, at least one of a plurality of third alignment marks arranged in the direction of the Y axis with respect to the first alignment mark is used for alignment. Moreover, when a shot region which is located on the outer circumferential portion of the substrate 1 and whose center is located in the range of ±45° front the X axis is subjected to alignment, a weight of the second alignment mark arranged at a position farthest from the center of the substrate 1 in the shot region is made lower than a weight of another second mark. In addition, when a shot region which is located on the outer circumferential portion of the substrate 1 and whose center is located within the range of ±45° from the Y axis is subjected to the alignment, a weight of the third alignment mark arranged at a position farthest from the center of the substrate 1 in the shot region is made lower than a weight of another third mark. It is possible to improve the overlay accuracy also as described above.

Second Embodiment

In a second embodiment, four alignment marks are used as alignment marks of a shot located on an outer circumferential portion of a substrate 1. When the four alignment marks are used, it is possible to measure an amount of deviation of a mold 10 with respect to the substrate 1 up to a higher-order shape. In addition, it is possible to further improve the overlay accuracy by correcting this amount of deviation.

Figure 10A:
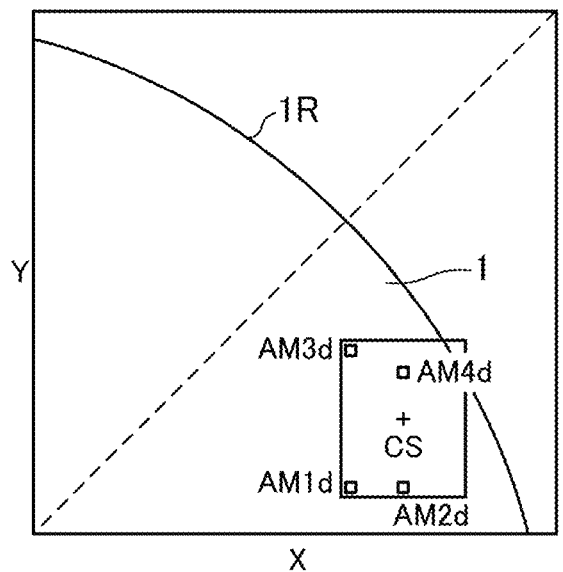
FIGS. 10A and 10B are diagrams illustrating an example of alignment marks of a shot located on an outer circumferential portion of a substrate according to a second embodiment.
Figure 10B:
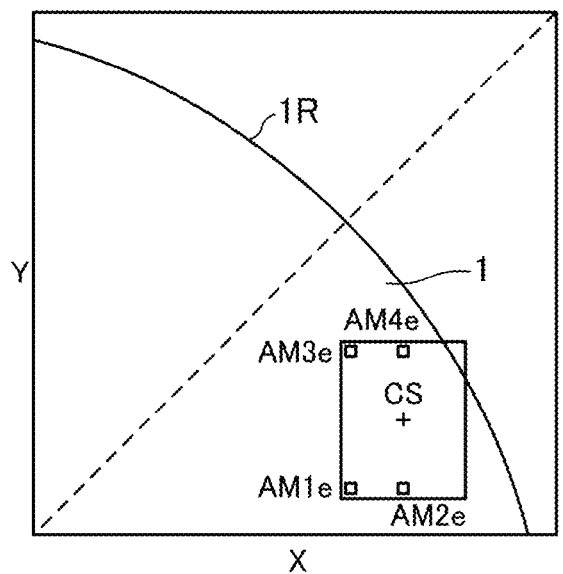

FIGS. 10A and 10B are diagrams illustrating an example of alignment marks of a shot located on the outer circumferential portion of the substrate 1 according to the second embodiment. FIGS. 10A and 10B illustrate alignment marks AM of a shot which is located on the outer circumferential portion of the substrate 1 and whose center of shot (CS) is within the range of ±45° from the X axis of the substrate 1. As a first alignment mark AM1$d$, a second alignment mark AM2$d$, and a third alignment mark AM3$d$ in FIG. 10A, alignment marks having the same position in a shot region as in the alignment mark AM illustrated in FIG. 6B are used. A fourth alignment mark AM4$d$ in FIG. 10A is arranged above the Y axis of the second alignment mark AM2$d$. Here, the arrangement above the Y axis of the second alignment mark AM2$d$ includes a case in which a part of the fourth alignment mark AM4$d$ is arranged above the Y axis passing through a part of the second alignment mark AM2$d$. It is possible to further improve the overlay accuracy using such alignment marks for alignment.

Also, as illustrated in FIG. 10B, the fourth alignment mark AM4$e$ may be arranged above the Y axis of the second alignment mark AM2$e$ and above the X axis of the third alignment mark AM3$e$. Here, the arrangement above the Y axis of the second alignment mark AM2$e$ includes a case in which a part of the fourth alignment mark AM4$e$ is arranged above the Y axis passing through a part of the second alignment mark AM2$e$. Furthermore, the arrangement above the X axis of the third alignment mark AM3$e$ includes a case in which a part of the fourth alignment mark AM4$e$ is arranged above the X axis passing through a part of the third alignment mark AM3$e$. Thus, the calculation for obtaining an amount of deviation of the mold 10 with respect to the substrate 1 can be simplified.

Figure 11A:
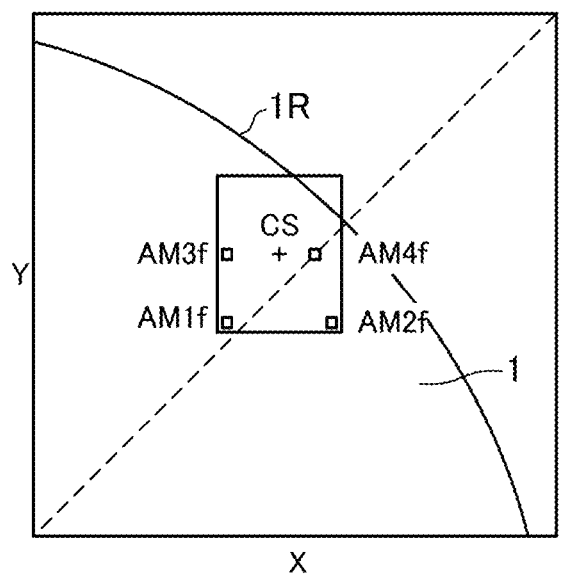
FIGS. 11A and 11B are diagrams illustrating an example of alignment marks of a shot located on the outer circumferential portion of the substrate according to the second embodiment.
Figure 11B:
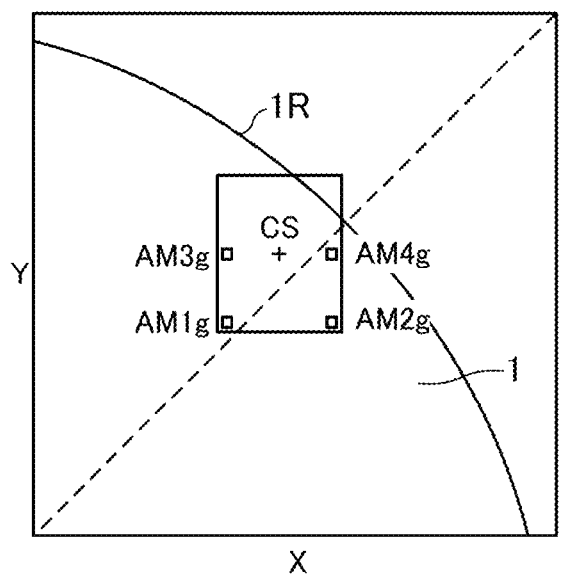

FIGS. 11A and 11B are diagrams illustrating an example of alignment marks of a shot located on the outer circumferential portion of the substrate 1 according to the second embodiment. FIGS. 11A and 11B illustrate alignment marks AM of a shot which is located on the outer circumferential portion of the substrate 1 and whose center of shot (CS) is within the range of ±45° from the Y axis of the substrate 1. As a first alignment mark AM1$f$, a second alignment mark AM2$f$, and a third alignment mark AM3$f$ in FIG. 11A, alignment marks which have the same position in the shot region as in the alignment marks AM illustrated in FIG. 8B are used. The fourth alignment mark AM4$f$ in FIG. 11A is arranged on the X axis of the third alignment mark AM3$f$. The arrangement above the X axis of the third alignment mark AM3$f$ includes a case in which a part of the fourth alignment mark AM4$f$ is arranged above the X axis passing through a part of the third alignment mark AM3$f$. It is possible to further improve the overlay accuracy using such alignment marks for alignment.

Also, as illustrated in FIG. 11B, a fourth alignment mark AM4$g$ may be arranged above the X axis of a third alignment mark AM3$g$ and above the Y axis of a second alignment mark AM2$g$. Here, the arrangement above the Y axis of the second alignment mark AM2$g$ includes a case in which a part of the fourth alignment mark AM4$g$ is arranged above the Y axis passing through a part of the second alignment mark AM2$g$. Furthermore, the arrangement of the X axis of the third alignment mark AM3$g$ includes a case in which a part of the fourth alignment mark AM4$g$ is arranged above the X axis passing through a part of the third alignment mark AM3$g$. Thus, it is possible to simplify the calculation for obtaining an amount of deviation of the mold 10 with respect to the substrate 1.

Third Embodiment

In Step S0 of the flowchart shown in FIG. 2, various parameters required for imprinting are set. The parameters also include information regarding a shot layout above the substrate 1 and an alignment mark to be used and a user needs to select an appropriate alignment mark for each shot in accordance with the shot layout. However, it is considered that the user does not select an appropriate alignment mark (hereinafter referred to as an "alignment mark to be recommended") according to a position of a shot as shown in the first embodiment or the second embodiment. Thus, the imprinting apparatus 100 has a function for issuing a warning to the user to prevent such a situation.

To be specific, the user selects an alignment mark to be used for alignment using, for example, an input unit such as a keyboard or a mouse. When the alignment mark selected by the user is different front the alignment mark according to the position of the shot as illustrated in the first embodiment or the second embodiment, the control unit 35 provides a warning regarding this situation to the user. Here, the warning includes, for example, displaying a warning image on an operation screen or emitting a wanting sound. Thus, when the user selects an alignment mark different from the alignment mark to lie recommended by the user, it is possible to easily notice this situation.

Also, the imprinting apparatus 100 may have a navigation function for selecting an appropriate alignment mark for each shot so that the user can select an appropriate alignment mark according to the position of the shot as illustrated in the first embodiment or the second embodiment.

To be specific, for example, in a display screen in which an alignment mark used for alignment is selected, the alignment mark to be recommended is displayed prominently or the alignment mark to be recommended is displayed using characters. Thus, the user can easily select the alignment mark to be recommended.

Embodiment of Method for Producing Article

A pattern of a cured product formed using the imprinting apparatus is used permanently for at least a part of various articles or temporarily when various articles are produced, lire articles include electric circuit elements, optical elements, MEMSs, recording elements, sensors, molds, and the like. Examples of the electric circuit elements include volatile or non-volatile semiconductor memories such as DRAMs, SRAMs, flash memories, and MRAMs, semiconductor elements such as LSIs, CCDs, image sensors, and FPGAs, and the like. Examples of the molds include imprinting moulds or the like.

The pattern of the cured product is used as it is as a constituent member of at least a part of the article or is temporarily used as a resist mask. In the substrate processing process, etching, ion implantation, or the like is performed and then the resist mask is removed.

Figure 12A:
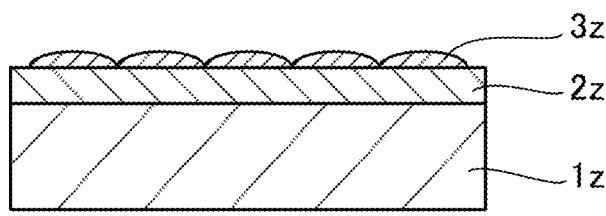
FIGS. 12A to 12F are diagrams for explaining a method for producing an article.

A specific method for producing an article will be described below. As illustrated in FIG. 12A, a substrate $1z$ such as a silicon wafer on which a material to be processed $2z$ such as an insulator is formed on a surface is prepared and then an imprint material $3z$ is applied to the surface of the material to be processed $2z$ using an inkjet method or the like. Here, a state in which a plurality of liquid-droplet-shaped imprint materials $3z$ are applied above the substrate is illustrated.

Figure 12B:
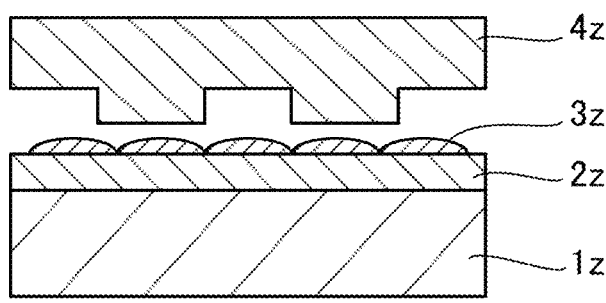
Figure 12C:
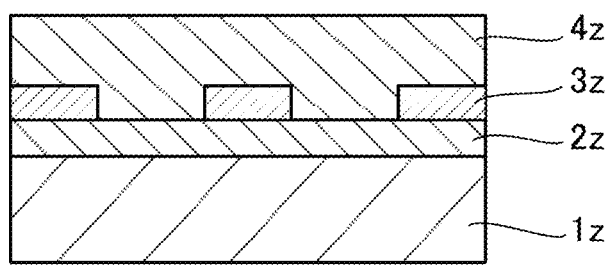

As illustrated in FIG. 12B, an imprinting mold $4z$ faces the imprint material $3z$ so that a side thereof on which a concave and convex pattern is formed is directed to the imprint material $3z$ above the substrate. As illustrated in FIG. 12C, the substrate $1z$ to which the imprint material $3z$ is applied is brought into contact with a mold $4z$ and pressure is applied to these. A gap between the mold $4z$ and the material to be processed $2z$ is filled with the imprint material $3z$. In this state, if light is radiated through the mold $4z$ as curing energy, the imprint material $3z$ is cured.

Figure 12D:
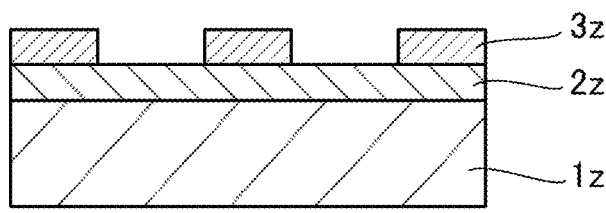

As illustrated in FIG. 12D, if the imprint material $3z$ is cured and then the mold $4z$ is separated from the substrate $1z$, a pattern of a cured product of the imprint material $3z$ is formed above the substrate $1z$. The pattern of the cured product has a shape in which a concave portion of a mould corresponds to a convex portion of the cured product and a convex portion of the mould corresponds to a concave portion of the cured product, that is, is a pattern in which a concave and convex pattern of the mold $4z$ is transferred to the imprint material $3z$.

Figure 12E:
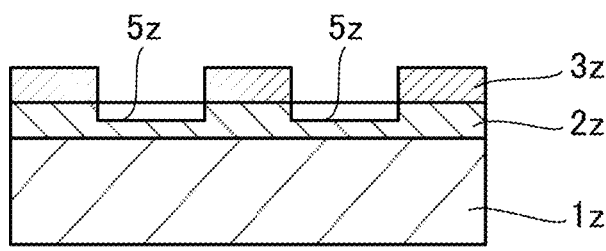
Figure 12F:
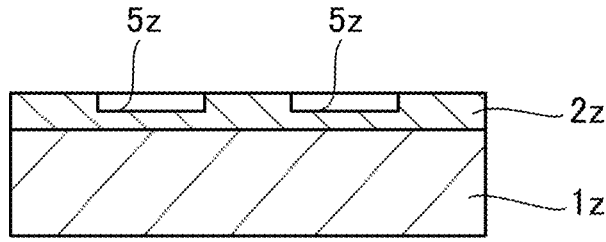

As illustrated in FIG. 12E, if etching is performed using the pattern of the cured product as an etching resistant mask, a portion of a surface of the material to be processed $2z$ in which the cured product is not present or the thin remaining cured product is present is removed so that a groove $5z$ is formed. As illustrated in FIG. 12F, if the pattern of the cured product is removed, it is possible to obtain an article in which the groove $5z$ is formed in the surface of the material to be processed $2z$. Here, although the pattern of the cured product is removed, the material may be used, for example, as a film for interlayer insulation contained in a semiconductor element or the like, that is, as a constituent member of an article, without being removed also after processing.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-214456, filed Nov. 27, 2019, which is hereby incorporated by reference wherein in its entirety.

What is claimed is:

1. An imprinting apparatus which forms a pattern of an imprint material above a shot region of a substrate by performing alignment between each shot region of the substrate and a mold using a plurality of marks provided in each shot region of the substrate and a plurality of marks on the mold, comprising:

a detection unit configured to detect at least a plurality of marks on the substrate in each shot region; and a control unit configured to use a first mark which is closest to a center of the substrate, a second mark which is arranged in a direction of a first axis along one side of the shot region with respect to the first mark, and a third mark which is arranged in a direction of a second axis perpendicular to the first axis with respect to the first mark for the alignment in each shot region, wherein the control unit uses, as the second mark, a mark which is arranged at a, position closer to the center of the substrate in the shot region than that in a case in which the shot region is not located on the outer circumferential portion of the substrate when a shot region which is located on an outer circumferential portion of the substrate and whose center is located within the range of ±45° from the first axis is subjected to the alignment, and the control unit uses, as the third mark, a mark which is arranged at a position closer to the center of the substrate in the shot region than that in a case in which the shot region is not located on the outer circumferential portion of the substrate when a shot region which is located on the outer circumferential portion of the substrate and whose center is located within the range of =45° from the second axis is subjected to the alignment.

2. The imprinting apparatus according to claim 1, wherein the control unit performs control so that a distance between the first mark and the second mark is shorter than a distance between the first mark and the third mark when a shot region which is located on the outer circumferential portion of the substrate whose center is located in the range of ±45° from the first axis is subjected to the alignment.

3. The imprinting apparatus according to claim 1, wherein the control unit performs control so that a distance between the first mark and the third mark is shorter than a distance between the first mark and the second mark when a shot region which is located on the outer circumferential portion of the substrate and whose center is located in the range of ±45 from the second axis is subjected to the alignment.

4. The imprinting apparatus according to claim 1, wherein the control unit uses, as the second mark, a mark arranged above the first axis passing through a center of the shot region when a shot region which is located on the outer circumferential portion of the substrate and whose center is located in the range of ±45° from the first axis is subjected to the alignment.

5. The imprinting apparatus according to claim 1, wherein the control unit uses, as the third mark, a mark arranged above the second axis passing through a center of the shot region when a shot region which is located on the outer circumferential portion of the substrate and whose center is located in the range of ±45° from the second axis is subjected to alignment.

6. The imprinting apparatus according to claim 1, wherein the control unit further uses, as a fourth mark, a mark arranged in a direction of the second axis with respect to the second mark when a shot region which is located on the outer circumferential portion of the substrate and whose center is located in the range of ±45° from the first axis is subjected to the alignment.

7. The imprinting apparatus according to claim 6, wherein the control unit uses, as the fourth mark, a mark which is located in a direction of the second axis with respect to the second mark and in a direction of the first axis with respect to the third mark when a shot region which is located on the outer circumferential portion of the substrate is subjected to the alignment.

8. The imprinting apparatus according to claim 1, wherein the control unit further uses, as a fourth mark, a mark arranged in a direction of the first axis with respect to the third mark when a shot region which is located on the outer circumferential portion of the substrate and whose center is located in the range of 45° from the second axis is subjected to alignment.

9. The imprinting apparatus according to claim 8, wherein the control unit uses, as the fourth mark, a mark which is located in a direction of the second axis with respect to the second mark and a direction of the first axis with respect to the third mark when a shot region which is located on the outer circumferential portion of the substrate is subjected to the alignment.

10. The imprinting apparatus according to claim 1, wherein the control unit performs control so that a warning is provided to the user when a mark selected by a user from a plurality of marks on the substrate is different from a mark used through the control unit.

11. The imprinting apparatus according to claim 1, wherein the control unit performs control so that a mark to be used through the control unit is displayed on a display screen when a shot region which is located on the outer circumferential portion of the substrate is subjected to the alignment.

12. An imprinting apparatus which forms a pattern of an imprint material above a shot region of a substrate by performing alignment between each shot region of the substrate and a mold using a plurality of marks provided in each shot region of the substrate and a plurality of marks on the mold, comprising:
 a detection unit configured to detect at least a plurality of marks on the substrate in each shot region; and
 a control unit configured to use a first mark which is closest to a center of the substrate, at least one of a plurality of second marks which are arranged in a direction of a first axis along one side of the shot region with respect to the first mark, and at least one of a plurality of third marks which are arranged in a direction of a second axis perpendicular to the first axis with respect to the first mark for the alignment in each shot region,
 wherein the control unit makes a weight of the second mark arranged at a position which is farthest from a center of the substrate in the shot region lower than a weight of another second mark when a shot region which is located on an outer circumferential portion of the substrate and whose center is located within the range of ±45° from the first axis is subjected to the alignment, and
 the control unit makes a weight of the third mark arranged at a position which is farthest from the center of the substrate in the shot region lower than a weight of another third mark when a shot region which is located on the outer circumferential portion of the substrate and whose center is located within the range of ±45° from the second axis is subjected to the alignment.

13. The imprinting apparatus according to claim 11, wherein the control unit does not use the reduced weighted second mark or the reduced weighted third mark for the alignment.

14. A substrate which is used for an imprinting apparatus which forms a pattern of an imprint material above a shot region of a substrate by performing alignment between each shot region of the substrate and a mold using a plurality of marks provided in each shot region of the substrate and a plurality of marks on the mold and in which a plurality of shot regions and a plurality of marks used for alignment with a mold are provided in each of the shot regions,
 wherein the imprinting apparatus includes a control unit configured to use a first mark which is closest to a center of the substrate, a second mark which is arranged in a direction of a first axis along one side of the shot region with respect to the first mark, and a third mark which is arranged in a direction of a second axis perpendicular to the first axis with respect to the first mark for the alignment in each shot region,
 the control unit uses, as the second mark, a mark which is arranged at a position closer to the center of the substrate in the shot region than that in a case in which the shot region is not located on the outer circumferential portion of the substrate when a shot region which is located on an outer circumferential portion of the substrate and whose center is located within the range of 4-5 from the first axis is subjected to the alignment,
 the control unit uses, as the third mark, a mark which is arranged at a position closer to the center of the substrate in the shot region than that in a case in which the shot region is not located on the outer circumferential portion of the substrate when a shot region which is located on the outer circumferential portion of the substrate and whose center is located within the range of =45° from the second axis is subjected to the alignment, the substrate includes a first mark which is closest to a center of the substrate, a second mark arranged in a direction of the first axis along one side of the shot region with respect to the first mark, and a third mark arranged in a direction of the second axis perpendicular to the first axis with respect to the first mark in each of the shot regions, the second mark is arranged at a position which is closer to the center of the substrate in the shot region than a shot region which is not located on the outer circumferential portion of the substrate in a shot region which is located on an outer circumferential portion of the substrate and whose center is located within the range of ±45° from the first axis, and the third mark is arranged at a position which is closer to the center of the substrate in the shot region than a shot region which is not located on the outer circumferential portion of the substrate in a shot region which is located on the outer circumferential portion of the substrate and whose center is located within the range of ±45° from the second axis.

15. A substrate which is used for an imprinting apparatus which forms a pattern of an imprint material above a shot region of a substrate by performing alignment between each shot region of the substrate and a mold using a plurality of marks provided in each shot region of the substrate and a plurality of marks on the mold and in which a plurality of shot regions and a plurality of marks used for alignment with a mold are provided in each of the shot regions, wherein the imprinting apparatus includes a detection unit configured to detect at least a plurality of marks on the substrate in each shot region; and a control unit configured to use a first mark which is closest to a center of the substrate, at least one of a plurality of second marks which are arranged in a direction of a first axis along one side of the shot region with respect to the first mark, and at least one of a plurality of third marks which are arranged in a direction of a second axis perpendicular to the first axis with respect to the first mark for the alignment in each shot region, the control unit makes a weight of the second mark arranged at a position which is farthest from a center of the substrate in the shot region lower than a weight of the other second marks when a shot region which is located on an outer circumferential portion of the substrate and whose center is located within the range of ±45° from the first axis is subjected to the alignment, the control unit makes a weight of the third mark arranged at a position which is farthest from the center of the substrate in the shot region lower than a weight of the other third marks when a shot region which is located on the outer circumferential portion of the substrate and whose center is located within the range of ±45° from the second axis is subjected to the alignment, the substrate includes a first mark which is closest to a center of the substrate, a second mark arranged in a direction of the first axis along one side of the shot region with respect to the first mark, and a third mark arranged in a direction of the second axis perpendicular to the first axis with respect to the first mark in each of the shot regions, the second mark is arranged at a position which is closer to the center of the substrate in the shot region than a shot region which is not located on the outer circumferential portion of the substrate in a shot region which is located on an outer circumferential portion of the substrate and whose center is located within the range of ±45° from the first axis, and the third mark is arranged at a position which is closer to the center of the substrate in the shot region than a shot region which is not located on the outer circumferential portion of the substrate in a shot region which is located on the outer circumferential portion of the substrate and whose center is located within the range of 45° from the second axis.

16. A mold which uses a plurality of marks provided in each shot region of the substrate and is used for an imprinting apparatus which forms a pattern of an imprint material above a shot region of a substrate by performing alignment between each shot region of the substrate and the mold and a plurality of marks on the mold, wherein the imprinting apparatus includes a control unit configured to use a first mark which is closest to a center of the substrate, a second mark which is arranged in a direction of a first axis along one side of the shot region with respect to the first mark, and a third mark which is arranged in a direction of a second axis perpendicular to the first axis with respect to the first mark for the alignment in each shot region, the control unit uses, as the second mark, a mark which is arranged at a position closer to the center of the substrate in the shot region than that in a case in which the shot region is not located on the outer circumferential portion of the substrate when a shot region which is located on an outer circumferential portion of the substrate and whose center is located within the range of ±45° from the first axis is subjected to the alignment, the control unit uses, as the third mark, a mark which is arranged at a position closer to the center of the substrate in the shot region than that in a case in which the shot region is not located on the outer circumferential portion of the substrate when a shot region which is located on the outer circumferential portion of the substrate and Whose center is located within the range of =45° from the second axis is subjected to the alignment, the substrate includes a plurality of marks for alignment between a plurality of shot regions and the mold which are provided in each shot region, a first mark which is closest to a center of the substrate, a second mark arranged in a direction of the first axis along one side of the shot region with respect to the first mark, and a third mark arranged in a direction of the second axis perpendicular to the first axis with respect to the first mark which are provided in each shot region, the second mark is arranged at a position which is closer to the center of the substrate in the shot region than a shot region which is not located on the outer circumferential portion of the substrate in a shot region which is located on an outer circumferential portion of the substrate and whose center is located within the range of ±45° from the first axis, the third mark is arranged at a position which is closer to the center of the substrate in the shot region than a shot region which is not located on the outer circumferential portion of the substrate in a shot region which is located on the outer circumferential portion of the substrate and whose center is located within the range of ±45° from the second axis, and the mold includes a plurality of marks provided at positions corresponding to the first to third marks included in the substrate.

17. A mold which uses a plurality of marks provided in each shot region of the substrate and is used for an imprinting apparatus which forms a pattern of an imprint material above a shot region of a substrate by performing alignment between each shot region of the substrate and the mold and a plurality of marks on the mold, wherein the imprinting apparatus includes:

a detection unit configured to detect at least a plurality of marks on the substrate in each shot region; and a control unit configured to use a first mark which is closest to a center of the substrate, at least one of a plurality of second marks which are arranged in a direction of a first axis along one side of the shot region with respect to the first mark, and at least one of a plurality of third marks which are arranged in a direction of a second axis perpendicular to the first axis with respect to the first mark for the alignment in each shot region, the control unit makes a weight of the second mark arranged at a position which is farthest from a center of the substrate in the shot region lower than a weight of the other second marks when a shot region which is located on an outer circumferential portion of the substrate and whose center is located within the range of ±45° from the first axis is subjected to the alignment, the control unit makes a weight of the third mark arranged at a position which is farthest from the center of the substrate in the shot region lower than a weight of the other third marks when a shot region which is located on the outer circumferential portion of the substrate and whose center is located within the range of ±45° from the second axis is subjected to the alignment, the substrate includes a plurality of marks for alignment between a plurality of shot regions and the mold which are provided in each shot region, a first mark which is closest to a center of the substrate, a second mark arranged in a direction of the first axis along one side of the shot region with respect to the first mark, and a third mark arranged in a direction of the second axis perpendicular to the first axis with respect to the first mark which are provided in each shot region, the second mark is arranged at a position which is closer to the center of the substrate in the shot region than a shot region which is not located on the outer circumferential portion of the substrate in a shot region which is located on an outer circumferential portion of the substrate and whose center is located within the range of ±45° from the first axis, the third mark is arranged at a position which is closer to the center of the substrate in the shot region than a shot region which is not located on the outer circumferential portion of the substrate in a shot region which is located on the outer circumferential portion of the substrate and whose center is located within the range of ±45° from the second axis, and the mold includes a plurality of marks provided at positions corresponding to the first to third marks included in the substrate.

* * * * *